United States Patent
Zhang et al.

(10) Patent No.: US 10,572,377 B1
(45) Date of Patent: Feb. 25, 2020

(54) ROW HAMMER REFRESH FOR CONTENT ADDRESSABLE MEMORY DEVICES

(71) Applicant: Micron Technology, Inc., Boise, ID (US)

(72) Inventors: Yu Zhang, Xuhui District (CN); Jun Wu, Su Zhou (CN); Yuan He, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/135,877

(22) Filed: Sep. 19, 2018

(51) Int. Cl.
| | |
|---|---|
| *G06F 12/00* | (2006.01) |
| *G06F 13/00* | (2006.01) |
| *G11C 15/04* | (2006.01) |
| *H03K 19/1776* | (2020.01) |
| *H03K 19/20* | (2006.01) |
| *G11C 11/408* | (2006.01) |
| *G11C 11/406* | (2006.01) |
| *G06F 13/28* | (2006.01) |

(52) U.S. Cl.
CPC .............. *G06F 12/00* (2013.01); *G11C 15/04* (2013.01); *H03K 19/1776* (2013.01); *H03K 19/20* (2013.01); *G06F 13/00* (2013.01); *G06F 13/28* (2013.01); *G11C 11/406* (2013.01); *G11C 11/408* (2013.01)

(58) Field of Classification Search
CPC ..... G11C 15/04; G11C 11/408; G11C 11/406; H03K 19/1776; H03K 19/20
See application file for complete search history.

(56) References Cited

U.S. PATENT DOCUMENTS

| | | | |
|---|---|---|---|
| 9,032,141 B2* | 5/2015 | Bains | G11C 11/4078 711/106 |
| 9,741,421 B1 | 8/2017 | Hedden | |
| 9,805,783 B2 | 10/2017 | Ito et al. | |
| 2005/0152199 A1* | 7/2005 | Park | G11C 7/18 365/222 |
| 2012/0250680 A1* | 10/2012 | Tsuchiya | H04L 45/54 370/389 |
| 2015/0003164 A1 | 1/2015 | Roohparvar | |
| 2015/0058549 A1* | 2/2015 | Jeffrey | G11C 7/02 711/106 |

(Continued)

FOREIGN PATENT DOCUMENTS

WO    2018/217582 A3    1/2019

OTHER PUBLICATIONS

Ito et al., Apparatus and Methods for Refreshing Memory, U.S. Appl. No. 15/789,897, filed Oct. 27, 2017.

(Continued)

*Primary Examiner* — Ajay Ojha
(74) *Attorney, Agent, or Firm* — TraskBritt

(57) ABSTRACT

A method of operating a memory device may include receiving, during each phase of a row hammer refresh (RHR) interval, at least one row hammer address (RHA) of a content addressable memory (CAM). The method may further include storing, during each phase of the RHR interval, a received RHA of the at least one received RHA in an address register. Moreover, the method may include refreshing each stored RHA of the CAM via a RHR during the RHR interval. Semiconductor devices and an electronic system are also described.

19 Claims, 15 Drawing Sheets

(56) References Cited

U.S. PATENT DOCUMENTS

2018/0005690 A1  1/2018  Morgan et al.
2018/0218767 A1  8/2018  Wolff

OTHER PUBLICATIONS

Lee, Joo-Sang, U.S. Appl. No. 16/391,560 titled Methods for Adjusting Row Hammer Refresh Rates and Related Memory Devices and Systems, filed Apr. 23, 2019.
Meier et al., U.S. Appl. No. 16/396,363 titled Methods for Controlling Row Hammer Refresh Operations of a Memory Device, and Related Memory Devices and Systems, filed Apr. 26, 2019.

* cited by examiner

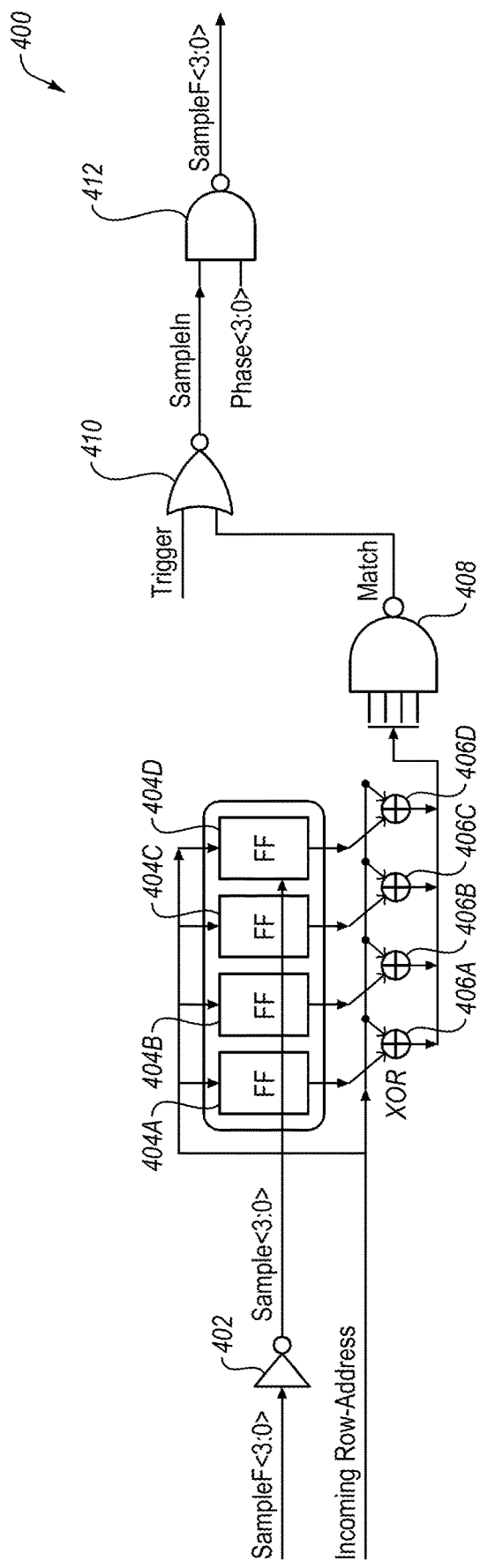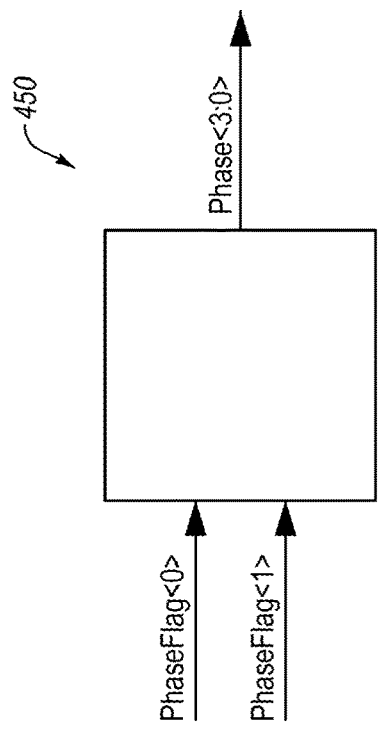
FIG. 4A
FIG. 4B

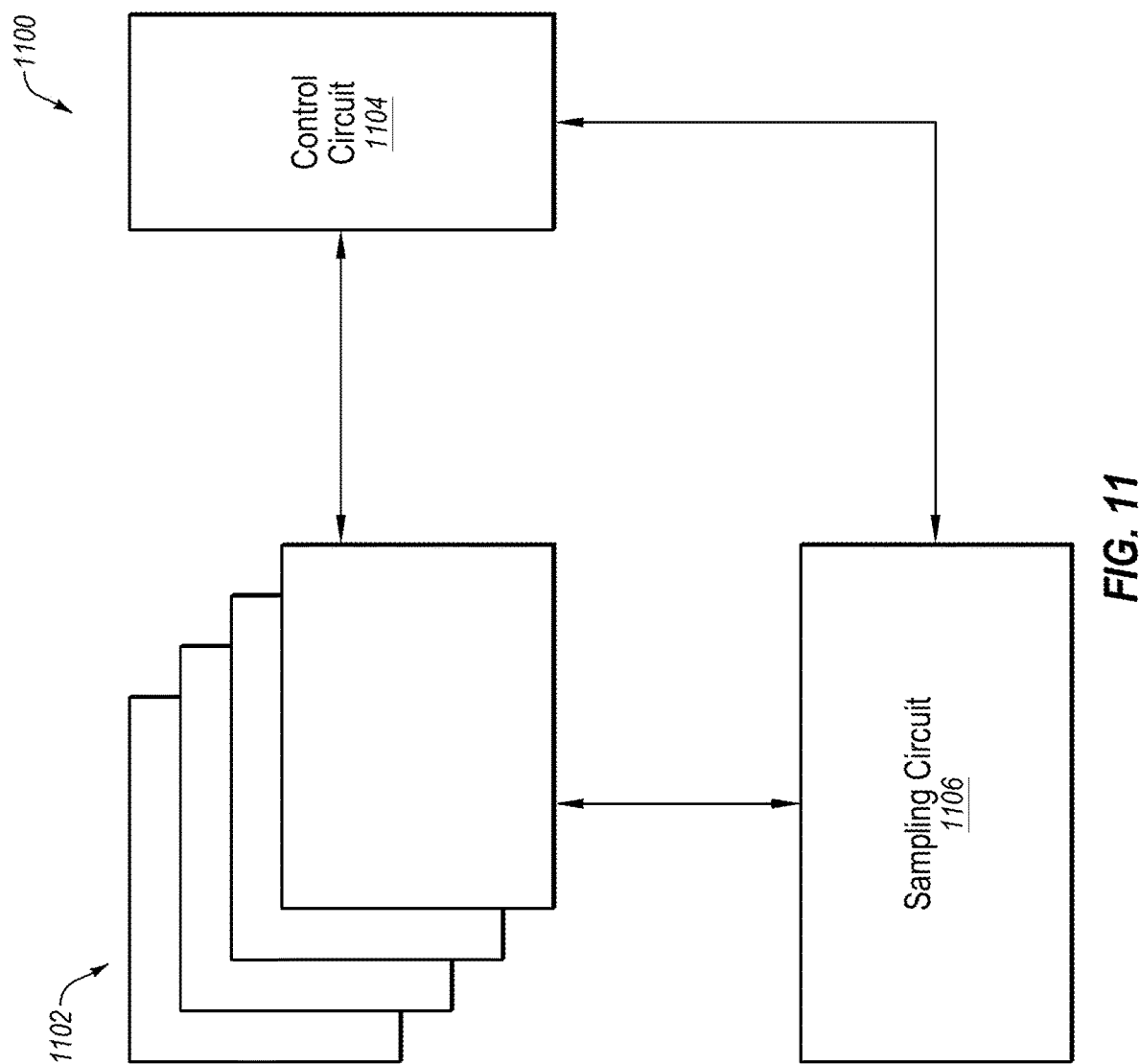

ROW HAMMER REFRESH FOR CONTENT ADDRESSABLE MEMORY DEVICES

TECHNICAL FIELD

Embodiments of the disclosure relate to row hammer refresh for memory devices, and, more specifically, to row hammer refresh for content addressable memory devices. Yet more specifically, various embodiments of the disclosure relate to capturing row hammer addresses for row hammer refresh for content addressable memory devices.

BACKGROUND

Memory devices are typically provided as internal, semiconductor, integrated circuits in computers or other electronic systems. There are many different types of memory including volatile and non-volatile memory. Volatile memory may require power to maintain its data (e.g., host data, error data, etc.) and includes random access memory (RAM), dynamic random access memory (DRAM), static random access memory (SRAM), synchronous dynamic random access memory (SDRAM), content addressable memory (CAM), and thyristor random access memory (TRAM), among others.

As memory density has increased, intermittent failure has appeared in some memory devices, which may experience failures due to repeated access to a particular row of memory cells (e.g., cells coupled to an access line). For example, rows physically adjacent a row being frequently accessed have an increased probability of experiencing data corruption. The repeated access of a particular row can be referred to as a "hammering" event, and the hammering of a row may cause issues such as migration across a passgate, for example. Leakage and parasitic currents caused by the hammering of a row may cause data corruption in a non-accessed physically adjacent row, which may be referred to as a neighbor row or victim row. The resulting corruption issue may be referred to as hammer disturb and/or row hammer disturb, for instance.

The row hammer effect is due to the nature of a memory cell, which can include one transistor and one capacitor. The charge state of a capacitor may determine whether a memory cell stores a "1" or "0" as a binary value. In addition, a large number of memory cells are packed tightly together. The closely packed cells may cause an activated capacitor to have an effect on a charge of an adjacent capacitor, especially when one of the cells is rapidly activated (e.g., a row hammer effect). In addition, the capacitors can have a natural discharge rate and may be rewritten in order to compensate for this discharge, referred to as "refreshing."

Some approaches to reducing the adverse effects of row hammering on adjacent rows include refreshing adjacent rows responsive to a determination that a hammering event has occurred. For example, responsive to determining that a particular row has been the target of repeated accesses (e.g., the row has undergone more than a threshold number of accesses within a refresh period), its physically adjacent neighbor rows may be selected for a targeted refresh operation, which may be referred to as a row hammer refresh operation.

BRIEF DESCRIPTION OF THE SEVERAL VIEWS OF THE DRAWINGS

FIG. 4A depicts a schematic diagram of an example circuit for storing row hammer addresses, according to various embodiments of the disclosure.

FIG. 4B is a block diagram of a phase generation circuit, in accordance with various embodiments of the disclosure.

FIG. 11 is a simplified block diagram of a memory device implemented according to one or more embodiments described herein.

DETAILED DESCRIPTION

Various embodiments of the disclosure relate to row hammer refresh (RHR) for content addressable memory (CAM). More specifically, for example, some embodiments of the disclosure relate to dividing an RHR interval into a plurality of phases (also referred to herein as "sub-periods") and randomly capturing (also referred to herein as "sampling" and/or "storing") a unique row hammer address (RHA) of a content addressable memory during each phase of the plurality of phases such that a plurality of unique RHAs may be stored in a plurality of address registers. Further, in some embodiments, the stored RHAs may be refreshed via a plurality of RHRs (e.g., four consecutive RHRs at an end of the RHR interval). Some embodiments disclosed herein may be referred to as a "multi-phase CAM" or more specifically, for example, a "four-phase CAM" or a "4-phase CAM."

In content addressable memory (CAM), which is also known as associative memory or associative storage, data may be utilized to access the contents of a memory array, in effect performing a search of the data. This contrasts with conventional approaches of utilizing a known address to access the location storing the data in a memory. CAMs generally utilize all or part of the contents of the data, accessing the data location by matching (typically in a simultaneous search) the data value in the CAM. A binary CAM may search for the "1s" and "0s" of each bit position in input data, while ternary CAM devices may search for "1s, 0s" and don't cares ("X") to match each bit position in input data. Once a match is found, the CAM may return the one or more addresses of one or more matches or, alternatively, additional associated data stored with the match. If no match is found, the CAM may indicate this with a signal or data return stating that no matching data was located. This may allow a CAM to be utilized as a hardware-based search device in applications that require fast searches or pattern matching, such as in databases, image or voice recognition, biometrics, data compression, cache memory controllers, or computer and communication networks (i.e., in a network switch or media access controller (MAC)).

CAMs are designed to quickly search its memory array in a single operation, and thus CAMS are much faster than equivalent memory and/or processor based data searches. CAM devices, however, are complex, volatile, require relatively large amounts of power to operate, and are typically of limited storage capacity.

Figure 1A:
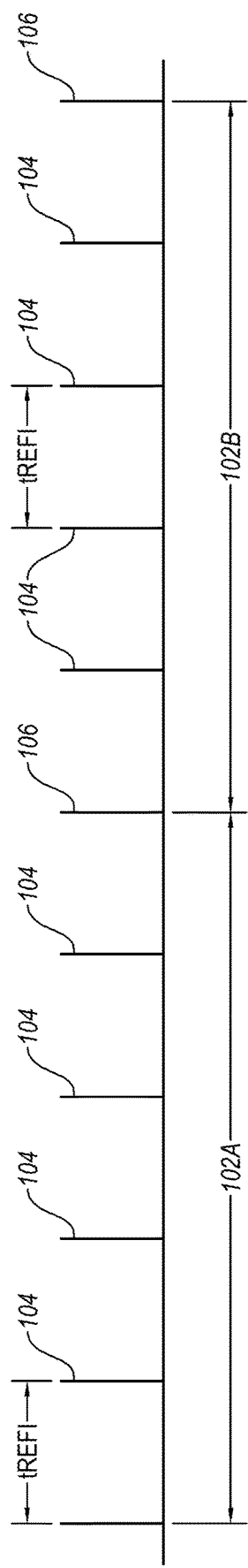
FIGS. 1A and 1B depict conventional various row hammer refresh intervals including auto refreshes and row hammer refreshes.

With reference to FIG. 1A, a plurality of conventional row hammer refresh (RHR) intervals 102A and 102B are illustrated. An RHR interval is a time duration between two adjacent RHRs. In the RHR intervals shown in FIG. 1A, auto refreshes, which are also commonly referred to as "auto refresh commands" or "AREFs" are depicted by reference numerals 104, and row hammer refreshes (RHRs), which are also commonly referred to as "RHR commands," are depicted by reference numerals 106. As depicted, each RHR interval 102A and 102B includes one RHR for every five refreshes and, thus, a "steal rate" in this example is 1/5 (i.e., one of every five refreshes is stolen as an RHR). A time duration between refreshes (i.e., either RHRs or auto refreshes) may be referred to as tREFI, as shown in FIG. 1A.

A series of refreshes performed one after another until all the rows of a memory device have been refreshed is commonly referred to as a "burst refresh." A burst refresh may modify one or more RHR intervals. More specifically, a burst refresh may modify the timing of auto refreshes, the timing of RHRs, and/or the timing of capturing row hammer addresses.

Figure 1B:
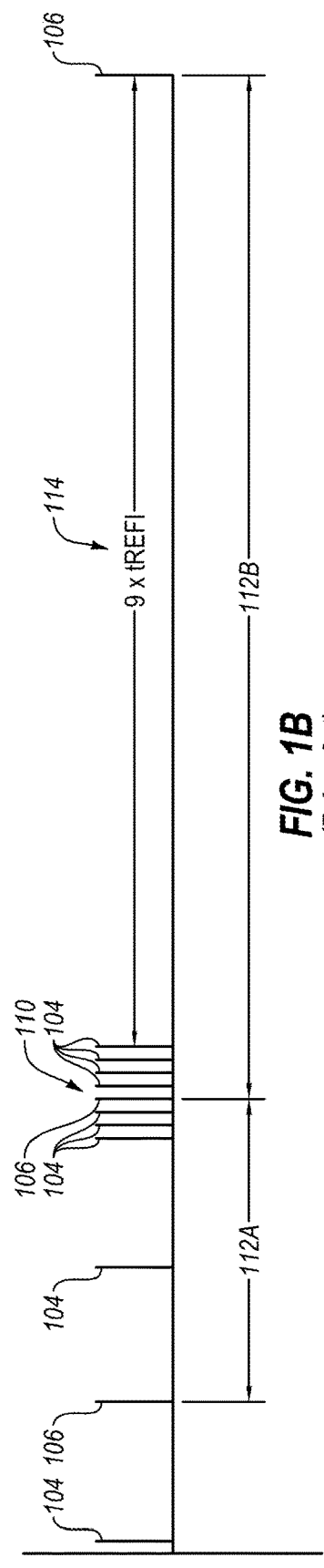

FIG. 1B depicts RHR intervals 112A and 112B, wherein in this example RHR interval 112A may be considered a short RHR interval and RHR interval 112B may be considered a long RHR interval. Further, as illustrated in FIG. 1B, due to a burst refresh 110, a relatively lengthy no sampling period 114 exists in RHR interval 112B. Period 114, which in this example has a duration of 9×tREFI, may reduce row hammer address (RHA) detection, which may be problematic.

Figure 1C:
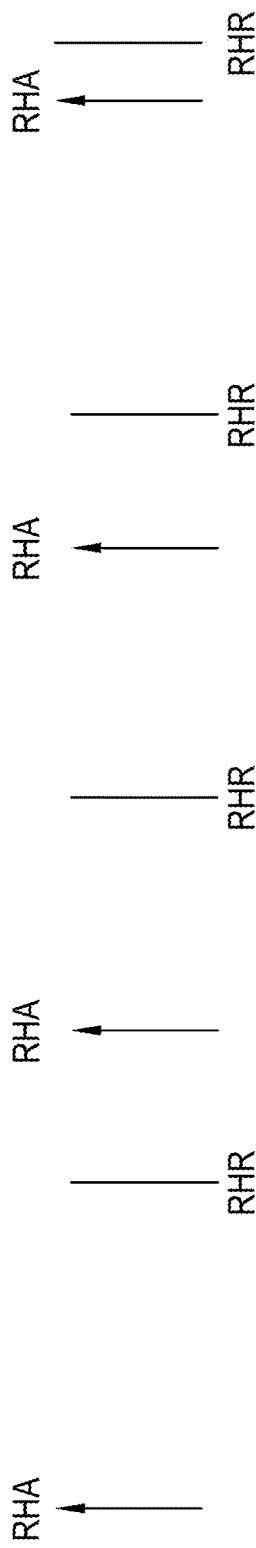
FIG. 1C illustrates a plurality of conventional row hammer refresh intervals, wherein each row hammer refresh interval includes a single captured row hammer address.

In some conventional methods, as illustrated in a timing diagram of FIG. 1C, only one RHA is captured and refreshed via an RHR during an RHR interval. These methods may be referred to as "one seed RHRs." In other conventional methods, an RHR interval may be extended (e.g., by a factor of 4) and a plurality of RHAs may be captured during the RHR interval. Further, in methods including an extended RHR interval, a plurality of RHRs may be consecutively executed (e.g., at an end of the RHR) to refresh the plurality of captured RHAs. More specifically, for example, an RHR interval may be extended by a factor of four and during the RHR interval, four RHAs may be captured. The four captured RHAs may be refreshed via four RHRs (e.g., four consecutive RHRs at end of the RHR interval). These methods may be referred to as a "four seed RHRs."

Figure 2A:
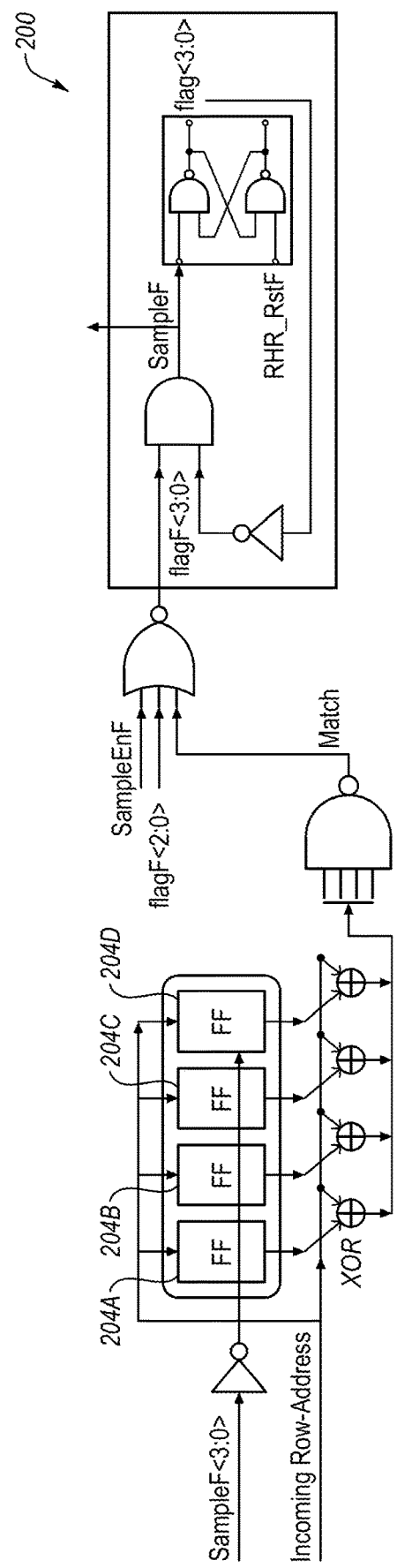
FIG. 2A is a schematic diagram of a conventional circuit for storing row hammer addresses.

FIG. 2A is a schematic diagram of a conventional circuit 200 for capturing RHAs in a plurality of address registers 204A-204D. During a contemplated operation of circuit 200, for an active register (e.g., register 204C), an incoming active address may be received and compared to one or more previously stored RHAs (e.g., RHAs stored in registers 204A and 204B) during an RHR interval. If the incoming active address matches a previously stored RHA (e.g., in either register 204A or register 204B), a Match signal will be high. When the Match signal is high, an address may not be stored in the active register (e.g., register 204C) and a state of a flag for the active register will be unchanged. If an incoming active address does not match a previously stored RHA (e.g., an RHA stored in either register 204A or register 204B), the Match signal will be low. If the Match signal is low, whether or not the incoming active address is stored in the active register may depend on the state of the flag for the active register. More specifically, if a flag for the active register is high, an address may not be stored in the register. Conversely, if the flag for the active register is low, and the Match signal for the register is low, an address may be stored in the active register. Thus, a flag of a register may forbid an RHA stored in the register from being overwritten.

With continued reference to FIG. 2A, after four different RHAs are stored in registers 204A-204D, the flags for each register 204A-204D may be in a locked state, which may prevent further sampling of RHAs during an RHR interval. Thus, only RHAs received early in an RHR interval may be sampled and, therefore, an undesirable lengthy time period may exist in which no sampling occurs for the remainder of the RHR interval.

Figure 2B:
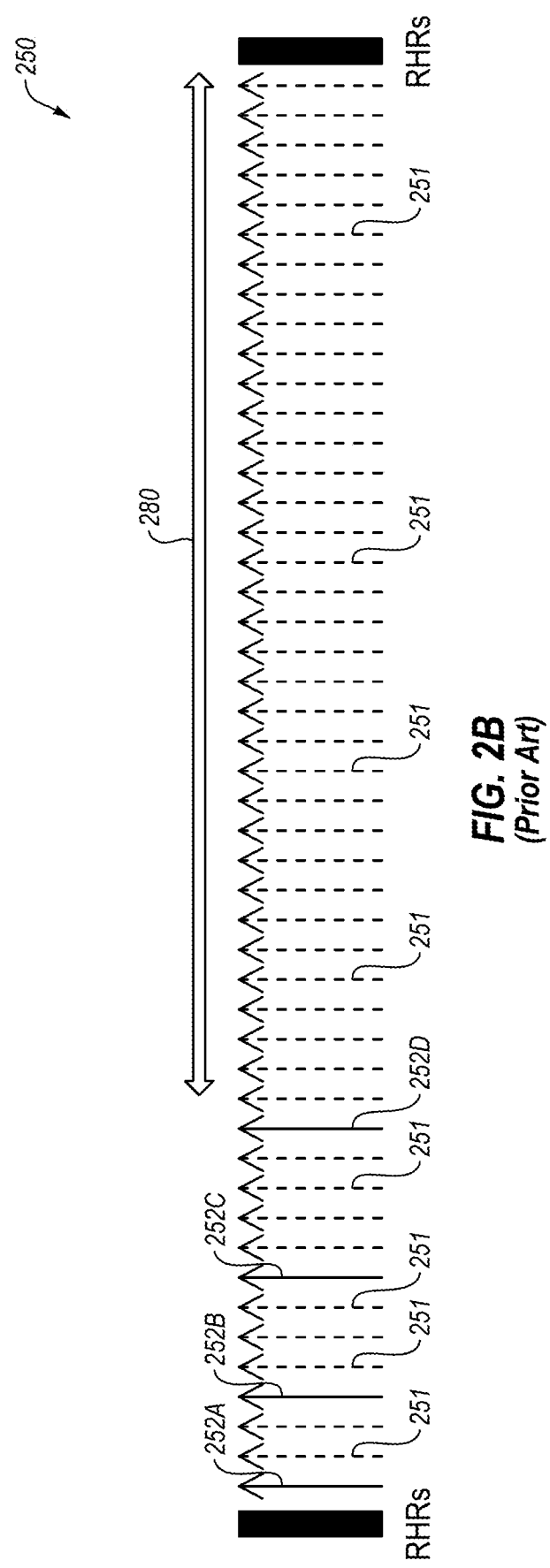
FIG. 2B is a timing diagram for a conventional row hammer refresh interval.

FIG. 2B depicts a timing diagram 250 of a conventional RHR interval including incoming row addresses 251. For example, with reference to FIG. 2A and timing diagram 250 of FIG. 2B, an RHA 252A may be received and stored in a first register 204A, an RHA 252B may be received and stored in a second register 204B, an RHA 252C may be received and stored in a third register 204C, and an RHA 252D may be received and stored in a fourth register 204D. Accordingly, the RHAs are not randomly captured. Rather, the first four different active addresses that are received are stored in the registers. Further, as noted above, after each register 204A-204D includes a stored RHA, additional RHA sampling may not occur for the remainder of the RHR interval. Therefore, a lengthy "no sampling period," as illustrated by reference numeral 280 in FIG. 2B, may exist. A lengthy no sampling period, such as period 280, may undesirably result in low RHA detection.

Figure 3A:
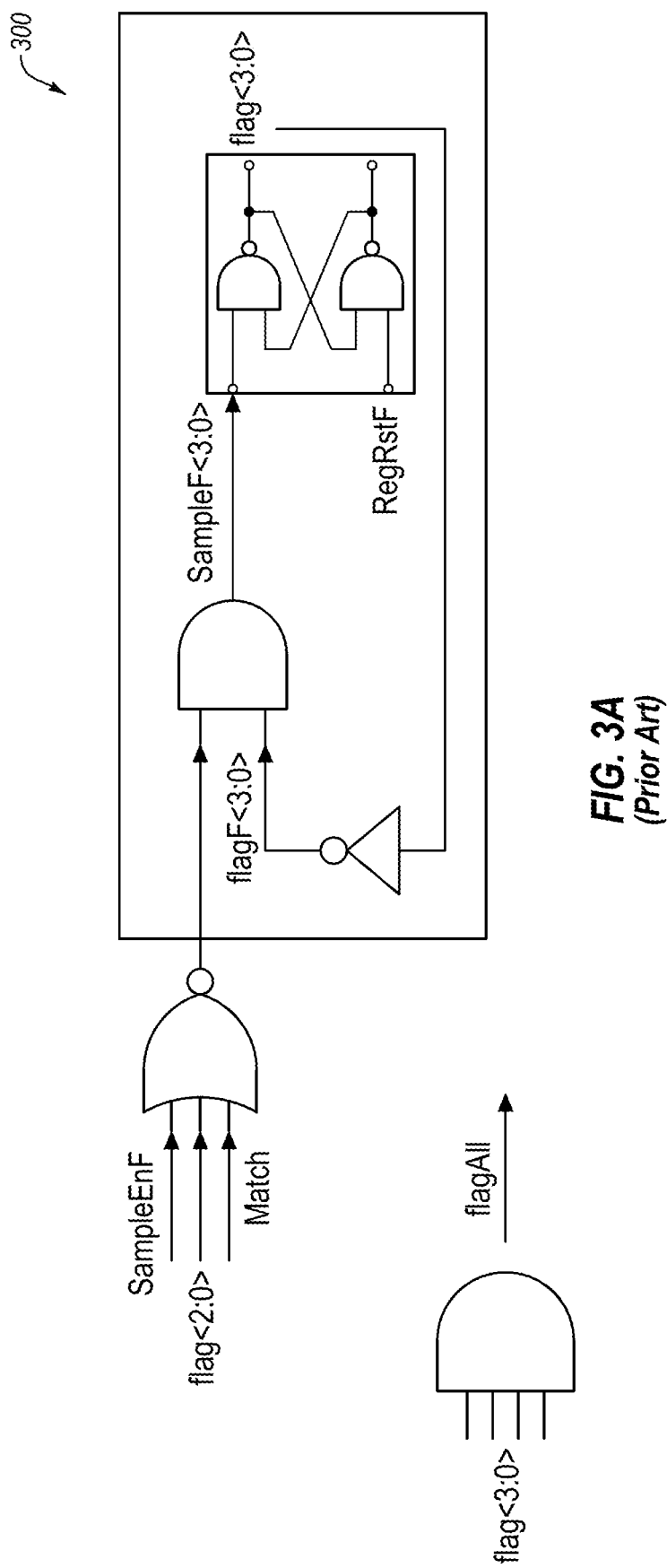
FIG. 3A is a schematic diagram of another conventional circuit for storing row hammer addresses.

In another conventional solution, after each register includes a stored address, the flags for each register may be reset (e.g., via a period reset signal) to an open state. FIG. 3A is a schematic circuit diagram of a circuit 300 for storing RHAs. During a contemplated operation of circuit 300, after all registers (e.g., registers 204A-204D of FIG. 2A) are full and a flag for each register is high, a flagALL signal may toggle to a locked state and prevent additional sampling until flag<3:0> is reset ("opened") via a reset signal (RegRstF) signal, which is based on a rising edge of an oscillation signal.

Figure 3B:
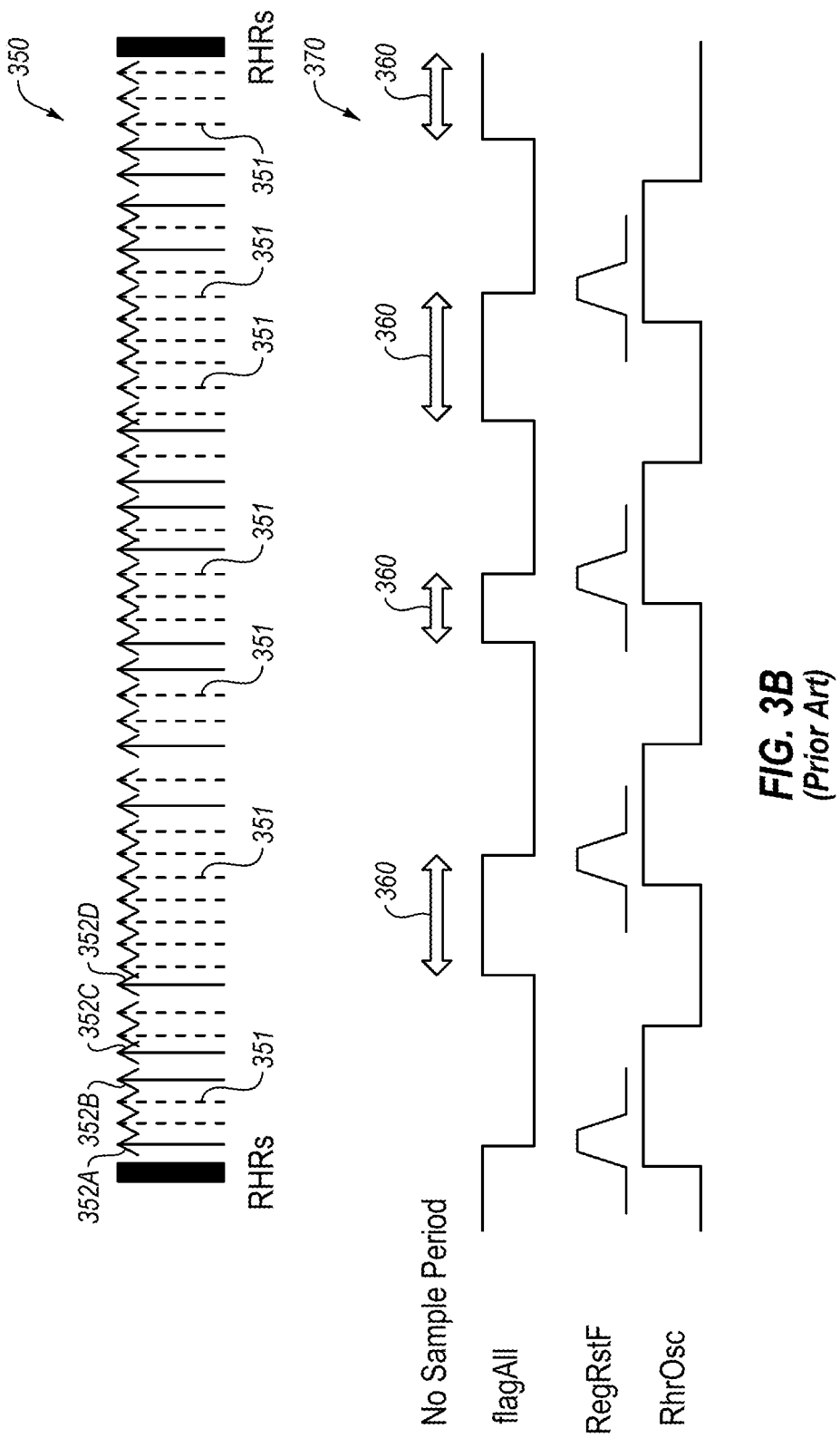
FIG. 3B depicts a conventional row hammer refresh interval and an associated timing diagram including various waveforms.

FIG. 3B depicts a conventional RHR interval 350 including incoming addresses 351, and an associated timing diagram 370 including various waveforms associated with conventional circuit 300 of FIG. 3A. With reference to FIGS. 3A and 3B, during a contemplated operation of circuit 300, in response to a rising edge of an oscillation signal RhrOSc, a signal RegRstF may reset ("open") the flags for each register. However, as illustrated in RHR interval 350 and timing diagram 370, after four RHAs 352A-352D are stored, a flag for each register will be high and a flagALL signal will toggle to a locked state and prevent additional RHAs from being stored until the flagALL signal is reset. Accordingly, while the flagALL signal is in a locked state, additional sampling may be prevented and lengthy, undesirable "no sampling periods" may exist, as depicted by reference numerals 360.

Various embodiments of the present disclosure relate to randomly storing RHAs during one or more RHR intervals. For example, in some embodiments, an RHR interval may be divided into a plurality of phases (e.g., also referred to herein as "sub-periods") and, during each phase, a unique RHA may be stored in a register. More specifically, for example, an RHA received during a first phase of the RHR interval may be stored in a first register as a first RHA, an RHA received during a second phase of the RHR interval may be stored in a second register as a second RHA, an RHA received during a third phase of the RHR interval may be stored in a third register as a third RHA, and an RHA received during a fourth phase of the RHR interval may be stored in a fourth register as a fourth RHA. In this example, each of the first RHA, the second RHA, the third RHA, and the fourth RHA may be different from one another.

Various embodiments disclosed herein may use a signal to trigger storage of an active address. For example, various embodiments may use a time-based signal (e.g., a SampleEnF signal) to trigger a storing operation. More specifically, for example, a SampleEnF signal, which may be high by default, may comprise a low pulse signal to trigger a storing operation. Further, various embodiments may utilize a randomly generated signal (e.g., referred to herein as "ArmSample") to trigger storage of an active address. Stated another way, an ArmSample signal may be used to store an active address as an RHA (also referred to herein as an "RHR seed address"). In some embodiments, a high pulse of an ArmSample signal may cause an active address to be stored into an active register. In some embodiments, if there are no active addresses during a high pulse of the ArmSample signal, the next active address after the high pulse of ArmSample signal may be stored.

According to some embodiments, one or more ArmSample pulses may occur during a single phase of an RHR interval. Stated another way, a number of ArmSample pulses during an RHR interval, and during each phase of the RHR interval may be random, and each phase of the RHR interval may include at least one ArmSample pulse. However, only one register may be active for each phase of an RHR interval. Thus, in some embodiments, subsequent ArmSample pulses during a phase of an RHR interval may cause an address to be stored over a previously stored RHA, assuming a Match signal is low.

For example, during each phase of an RHR interval, active address may be received sequentially. Further, for each received active address, a comparison may be made between a received address and the contents of one or more registers to determine if the received active address is already stored in a register. If the received address does not match an address stored in a register, a Match signal may be low. If the received address matches an address stored in a register, a Match signal may be high.

Further, during a first phase of an RHR interval, a first ArmSample pulse during the first phase may cause a first active address of the first phase to be stored in a first register as a first RHA for the RHR interval. Further, the next ArmSample pulse of the first phase (if one occurs) may cause a second active address of the first phase to be stored (i.e., if the Match signal is low). More specifically, if the second active address is the same as the first RHA, the Match signal may be high and the second active address of the first phase may not be stored in the first register. If the second active address of the first phase is different than the first RHA, the Match signal may be low and the second active address may be stored in the first register as the first RHA (i.e., overwriting the previously stored first RHA). This process may be repeated for each ArmSample pulse during the first phase of the RHR interval.

Further, during a second phase of the RHR interval, a first ArmSample pulse during the second phase may cause a first active address of the second phase to be stored (i.e., if the Match signal is low). More specifically, if the first active address of the second phase is different than the first RHA stored in the first register, the Match signal may be low and the first active address of the second phase may be stored in a second register as a second RHA of the RHR interval. If the first active address of the second phase is not different than the first RHA stored in the first register, the Match signal may be high and the first active address of the second phase may be discarded.

Moreover, the next ArmSample pulse of the second phase (if one occurs) may cause a second active address of the second phase to be stored (i.e., if the Match signal is low). More specifically, if the second active address of the second phase is the same as the first RHA or the second RHA, the Match signal may be high and the second active address of the second phase may not be stored in the second register. If the second active address of the second phase is different than the first RHA and the second RHA, the Match signal may be low and the second active address of the second phase may be stored in the second register as the second RHA (i.e., overwriting the previously stored second RHA). This process may be repeated for each ArmSample pulse during the second phase of the RHR interval.

During a third phase of the RHR interval, a first ArmSample pulse during the third phase may cause a first active address of the third phase to be stored (i.e., if the Match signal is low). More specifically, if the first active address of the third phase is different than the first RHA and the second RHA, the Match signal may be low and the first active address of the third phase may be stored in a third register as a third RHA of the RHR interval. If the first active address of the third phase is not different than the first RHA and the second RHA, the Match signal may be high and the first active address of the third phase may be discarded.

Further, the next ArmSample pulse of the third phase (if one occurs) may cause a second active address of the third phase to be stored (i.e., if the Match signal is low). More specifically, if the second active address of the third phase is the same as the first RHA, the second RHA, or the third RHA, the Match signal may be high and the second active address of the third phase may not be stored in the third register. If the second active address of the third phase is different than the first RHA, the second RHA, and the third RHA, the Match signal may be low and the second active address of the third phase may be stored in the third register as the third RHA (i.e., overwriting the previously stored third RHA). This process may be repeated for each ArmSample pulse during the third phase of the RHR interval.

During a fourth phase of the RHR interval, a first ArmSample pulse during the fourth phase may cause a first active address of the fourth phase to be stored (i.e., if the Match signal is low). More specifically, if the first active address of the fourth phase is different than the first RHA, the second RHA, and the third RHA, the Match signal may be low and the first active address of the fourth phase may be stored in a fourth register as a fourth RHA of the RHR interval. If the first active address of the fourth phase is not different than the first RHA, the second RHA, and the third RHA, the Match signal may be high and the first active address of the fourth phase may be discarded.

Additionally, the next ArmSample pulse of the fourth phase (if one occurs) may cause a second active address of the fourth phase to be stored (i.e., if the Match signal is low). More specifically, if the second active address of the fourth phase is the same as the first RHA, the second RHA, the third RHA, or the fourth RHA, the Match signal may be high and the second active address of the fourth phase may not be stored in the fourth register. If the second active address of the fourth phase is different than the first RHA, the second RHA, the third RHA, and the fourth RHA, the Match signal may be low and the second active address of the fourth phase may be stored in the fourth register as the fourth RHA (i.e., overwriting the previously stored fourth RHA). This process may be repeated for each ArmSample pulse during the fourth phase of the RHR interval.

FIG. 4A depicts a schematic diagram of an example circuit 400 for storing RHAs, according to various embodiments of the present disclosure. Circuit 400, which may also be referred to herein as a "row hammer refresh control circuit," includes inverter 402, address registers 404A-404D, comparators 406A-406D, and a NAND gate 408. According to at least some embodiments, each of registers 404A-404D may include a CAM address register. Circuit 400 further includes a NOR gate 410, and a NAND gate 412.

As illustrated, inverter 402 may receive a SampleF<3:0> signal, which may include a sample clock signal. Inverter 402 may output a Sample<3:0> signal, which may be used to select a register (e.g., register 404A, register 404B, register 404C, or register 404D). For example, if a Sample<0> signal is high, register 404A (also referred to as "register0") may be selected (i.e., register 404A is the active register). As another example, if a Sample<3> signal is high, register 404D (also referred to as "register3") may be selected (i.e., register 404D is the active register).

Comparators 406A-406D, upon receipt of an incoming row-address, may compare the incoming row-address to addresses stored in address registers 404A-404D. An output of each comparator 406A-406D is coupled to an input of NAND gate 408. An output of NAND gate 408 is coupled to one input of NOR gate 410. Another input of NOR gate 410 is configured to receive a Trigger signal, such as a SampleEnF signal or an ArmSample signal, as described more fully herein. An output of NOR gate 410 is coupled to one input of NAND gate 412. Another input of NAND gate 412 is configured to receive a Phase<3:0> signal. NAND gate 412 is configured to generate the SampleF<3:0> signal, which may be provided to an input of inverter 402.

It is noted that the Phase<3:0> signal may determine which phase of an RHR interval is active, and also which address register is active. For example, if a Phase<0> signal is high, a SampleF<0> signal may be set low by, for example, a low pulse of the Trigger signal, and a Sample<0> signal may be high, and thus the first address register (e.g., register 404A) may be active (i.e., Register® is accessible). Conversely, if the Phase<0> signal is low, the SampleF<0> signal is high, the Sample<0> signal is low, and thus, the first address register (e.g., register 404A) may be inactive (i.e., Register® is not accessible).

FIG. 4B is a block diagram of a phase generation circuit 450, in accordance with various embodiments of the disclosure. Phase generation circuit 450, which may include one or more logic gates, may be configured to receive one or more phase control signals (i.e., a PhaseFlag<0> signal and/or a PhaseFlag<1> signal), and generate the Phase<3:0> signal based on the one or more phase control signals. Further, in at least some embodiments, phase generation circuit 450 may be configured to convey the Phase<3:0> signal to circuit 400 of FIG. 4A. Phase control signals PhaseFlag<0> and PhaseFlag<1> will be described more fully below with reference to at least FIGS. 6 and 7.

It is noted that although circuit 400 of FIG. 4A includes four address registers and the description refers to a four phase RHR interval, embodiments of the disclosure are not so limited. Rather, embodiments of the disclosure are applicable to circuits including more or less than four registers, and/or circuits configured for more than or less than four phases. In some embodiments, for example, the number of address registers may be equal to the number of phases. Further, in at least some embodiments, circuit 400 may be configured to generate and/or transmit one or more commands (e.g., RHR commands) to another device (e.g., a memory array). In other embodiments, circuit 400 may implemented within a device and/or other circuitry that is configured to generate and/or transmit one or more commands (e.g., RHR commands). It is further noted that circuit 400 is provided as an example circuit for capturing RHAs, and it will be appreciated by a person having ordinary skill in the art that other circuits for capturing RHAs (e.g., into one or more address registers) may be used for implementing various embodiments of the disclosure.

A contemplated operation of circuit 400 will now be described. During a first phase (e.g., phase0), a high Phase<0> signal may be received at NAND gate 412. Moreover, during the first phase, comparator 406A may receive an incoming row-address, and may compare the incoming row-address to the data within address register 404A. If the incoming active address matches the data (e.g., an RHA) stored in register 404A, the Match signal, which is output from NAND gate 408, may be high. If the incoming active address does not match the contents stored in register 404A, the Match signal may be low.

If the Match signal and the Trigger signal are low, the SampleIn signal may be high, the SampleF<0> signal may be low, the Sample<0> signal may be high, and the incoming active address may be stored in register 404A. Stated another way, because the incoming active address does not match the address stored in register 404A, and the Trigger signal is low (e.g., to trigger a storing operation), register 404A is active and the incoming active address may be stored in register 404A.

If the Match signal is high, the SampleIn signal may be low, the SampleF<0> signal may be high, and the Sample<0> signal may be low, and register 404A may not be accessible. Stated another way, because the incoming active address matched the address stored in register 404A, the incoming active address may not be stored in register 404A.

During a second phase (e.g., phase1), a high Phase<1> signal may be received at NAND gate 412. Moreover, during the second phase, comparators 406A and 406B may receive an incoming row-address, and may compare the incoming row-address to the data within address registers 404A and 404B. If the incoming active address matches the data (e.g., an RHA) stored in either register 404A or register 404B, the Match signal may be high. If the incoming active address does not match the contents stored in either register 404A or register 404B, the Match signal may be low.

If the Match signal and the Trigger signal are low, the SampleIn signal may be high, the SampleF<1> signal may be low, the Sample<1> signal may be high, and the incoming active address may be stored in register 404B. Stated another way, because the incoming active address does not match the address stored in either register 404A or register 404B, and the Trigger signal is low (e.g., to trigger a storing operation), register 404B is active and the incoming active address may be stored in register 404B.

If the Match signal is high, the SampleIn signal may be low, the SampleF<1> signal may be high, and the Sample<1> signal may be low, and register 404B may not be accessible. Stated another way, because the incoming active address matched either the address stored in register 404A or the address stored in register 404B, the incoming active address may not be stored in register 404B.

During a third phase (e.g., phase2), a high Phase<2> signal may be received at NAND gate 412. Moreover, during the third phase, comparators 406A, 406B, and 406C may receive an incoming row-address, and may compare the incoming row-address to the data within address registers 404A, 404B, and 404C. If the incoming active address matches the data (e.g., an RHA) stored in either register 404A, register 404B, or register 404C, the Match signal may be high. If the incoming active address does not match the contents stored in either register 404A, register 404B, or register 404C, the Match signal may be low.

If the Match signal and the Trigger signal are low, the SampleIn signal may be high, the SampleF<2> signal may be low, the Sample<2> signal may be high, and the incoming active address may be stored in register 404C. Stated another way, because the incoming active address does not match the address stored in either register 404A, register 404B, or register 404C, and the Trigger signal is low (e.g., to trigger a storing operation), register 404C is active, and the incoming active address may be stored in register 404C.

If the Match signal is high, the SampleIn signal may be low, the SampleF<2> signal may be high, and the Sample<2> signal may be low, and register 404C may not be accessible. Stated another way, because the incoming active address matched either the address stored in register 404A, the address stored in register 404B, or the address stored in register 404C, the incoming active address may not be stored in register 404C.

During a fourth phase (e.g., phase3), a high Phase<3> signal may be received at NAND gate 412. Moreover, during the fourth phase, comparators 406A, 406B, 406C, and 406D may receive an incoming row-address, and may compare the incoming row-address to the data within address registers 404A, 404B, 404C, and 404D. If the incoming active address matches the data (e.g., an RHA) stored in either register 404A, register 404B, register 404C, or register 404D, the Match signal may be high. If the incoming active address does not match the contents stored in either register 404A, register 404B, register 404C, or register 404D, the Match signal may be low.

If the Match signal and the Trigger signal are low, the SampleIn signal may be high, the SampleF<3> signal may be low, the Sample<3> signal may be high, and the incoming active address may be stored in register 404D. Stated another way, because the incoming active address does not match the address stored in either register 404A, register 404B, register 404C, or register 404D, and the Trigger signal is low (e.g., to trigger a storing operation), register 404D is active and the incoming active address may be stored in register 404D.

If the Match signal is high, the SampleIn signal may be low, the SampleF<3> signal may be high, the Sample<3> signal may be low, and register 404D may not be accessible. Stated another way, because the incoming active address matched either the address stored in register 404A, the address stored in register 404B, the address stored in register 404C, or the address stored in register 404D, the incoming active address may not be stored in register 404D.

In at least some embodiments, each register 404A-404D may be cleared at an end of an RHR interval. Thus, in at least these embodiments, each register 404A-404D may be empty at the start of an RHR interval.

Figure 5:
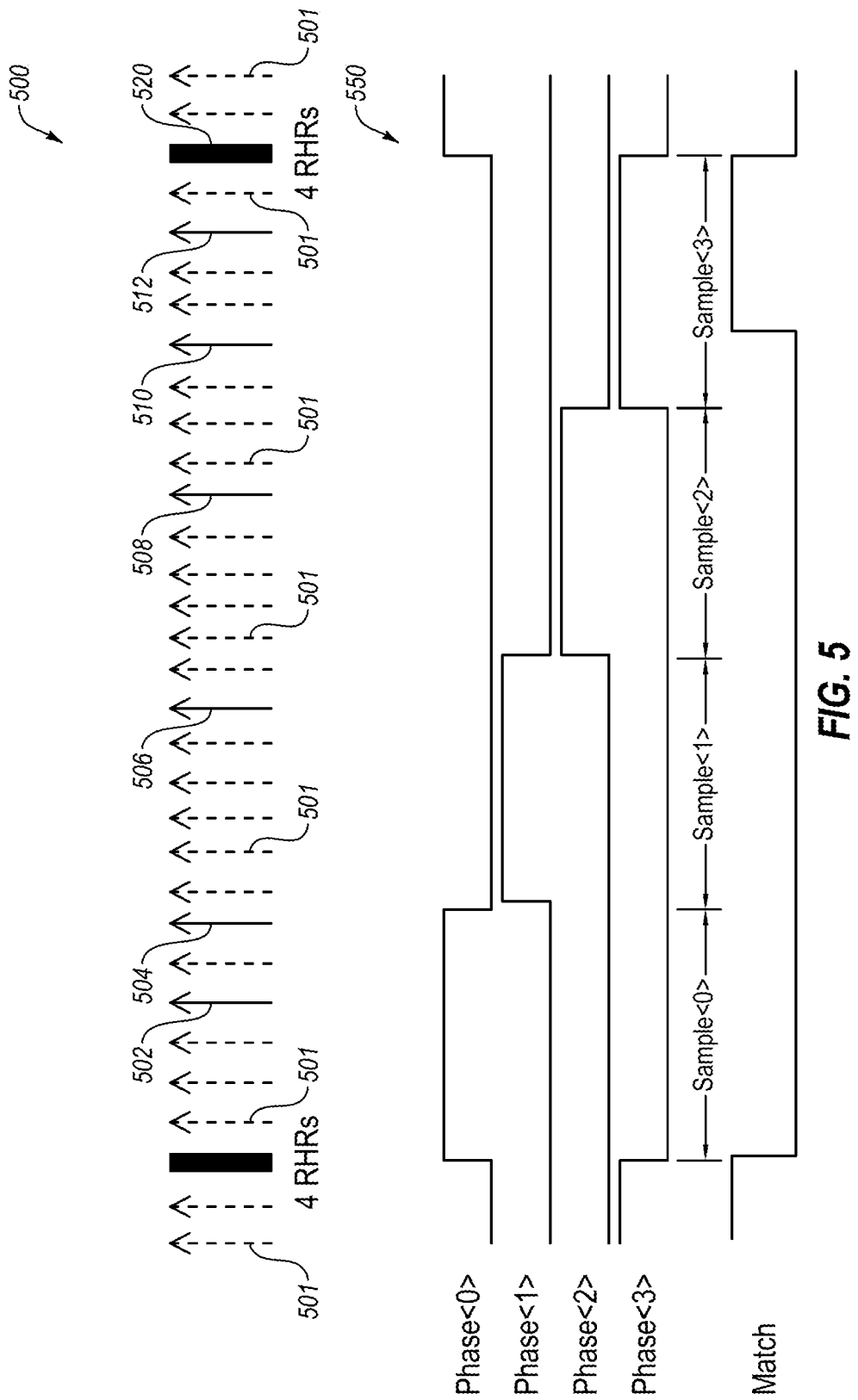
FIG. 5 depicts an example row hammer refresh interval and an associated timing diagram including various waveforms for signals associated with the circuit of FIG. 4A, according to one or more embodiments of the disclosure.

FIG. 5 depicts an example RHR interval 500 including incoming addresses 501, and an associated timing diagram 550 including various waveforms associated with circuit 400 of FIG. 4A. More specifically, timing diagram 550 includes a waveform for each of a plurality of phase signals Phase<0>, Phase<1>, Phase<2>, and Phase<3>, and a Match signal.

As illustrated in FIG. 5, during a first phase of an RHR interval, phase signal Phase<0> is high, and phase signals Phase<1>, Phase<2>, and Phase<3> and the Match signal are low, and, thus, in response to a trigger signal (e.g., ArmSample) during the first phase, an active address (e.g., indicated by reference numeral 502) may be stored in a first register (e.g., address register 404A of FIG. 4A) as a first RHA. Further, in response to another trigger signal (e.g., ArmSample) during the first phase, the Match signal is low, and thus a second active address (e.g., indicated by reference numeral 504) may be stored in the first register (e.g., address register 404A of FIG. 4A) as the first RHA (i.e., the previously stored RHA in the first register is overwritten).

Further, during a second phase of the RHR interval, phase signal Phase<1> is high, and phase signals Phase<0>, Phase<2>, and Phase<3> and the Match signal are low, an thus, in response to a trigger signal (e.g., ArmSample) during the second phase, an active address (e.g., indicated by reference numeral 506) may be stored in a second register (e.g., address register 404B of FIG. 4A) as a second RHA.

During a third phase of the RHR, phase signal Phase<2> is high, and phase signals Phase<0>, Phase<1>, and Phase<3> and the Match signal are low, and thus, in response to a trigger signal (e.g., ArmSample) during the third phase, an active address (e.g., indicated by reference numeral 508) may be stored in a third register (e.g., address register 404C of FIG. 4A) as a third RHA.

Moreover, during a fourth phase of the RHR interval, phase signal Phase<3> is high, and phase signals Phase<0>, Phase<1>, and Phase<2> and the Match signal are low, and thus, in response to a trigger signal (e.g., ArmSample) during the fourth phase, an active address (e.g., indicated by reference numeral 510) may be stored in a fourth register (e.g., address register 404D of FIG. 4A) as a fourth RHA. Further, in response to another trigger signal (e.g., ArmSample) during the fourth phase, another active address (e.g., indicated by reference numeral 512) may be identified. However, in this example, the Match signal is high while the trigger signal is asserted, and thus the second active address (e.g., indicated by reference numeral 512) of the fourth phase is not stored in the fourth register as the fourth RHA (i.e., the previously stored RHA in the fourth register is not overwritten). Additionally, in this example, a plurality of RHRs (indicated by reference numeral 520) may be executed (e.g., consecutively) to refresh the RHAs (e.g., the RHAs indicated by reference numerals 504, 506, 508, and 510).

According to some embodiments, a time duration of a phase (e.g., a duration of Phase<0>; see, e.g., FIG. 5)) may be calculated according to tREFI*N, wherein tREFI is a time duration of interval between refreshes (a "refresh interval"), N is the average number of refreshes per RHR interval, and a steal rate is 1/N. As non-limiting examples, tREFI may by determined via a mode register and a steal rate may be determined via a steal rate table (e.g., a look-up table). Thus, in some embodiments, a refresh rate and/or a steal rate may be settable.

Figure 6:
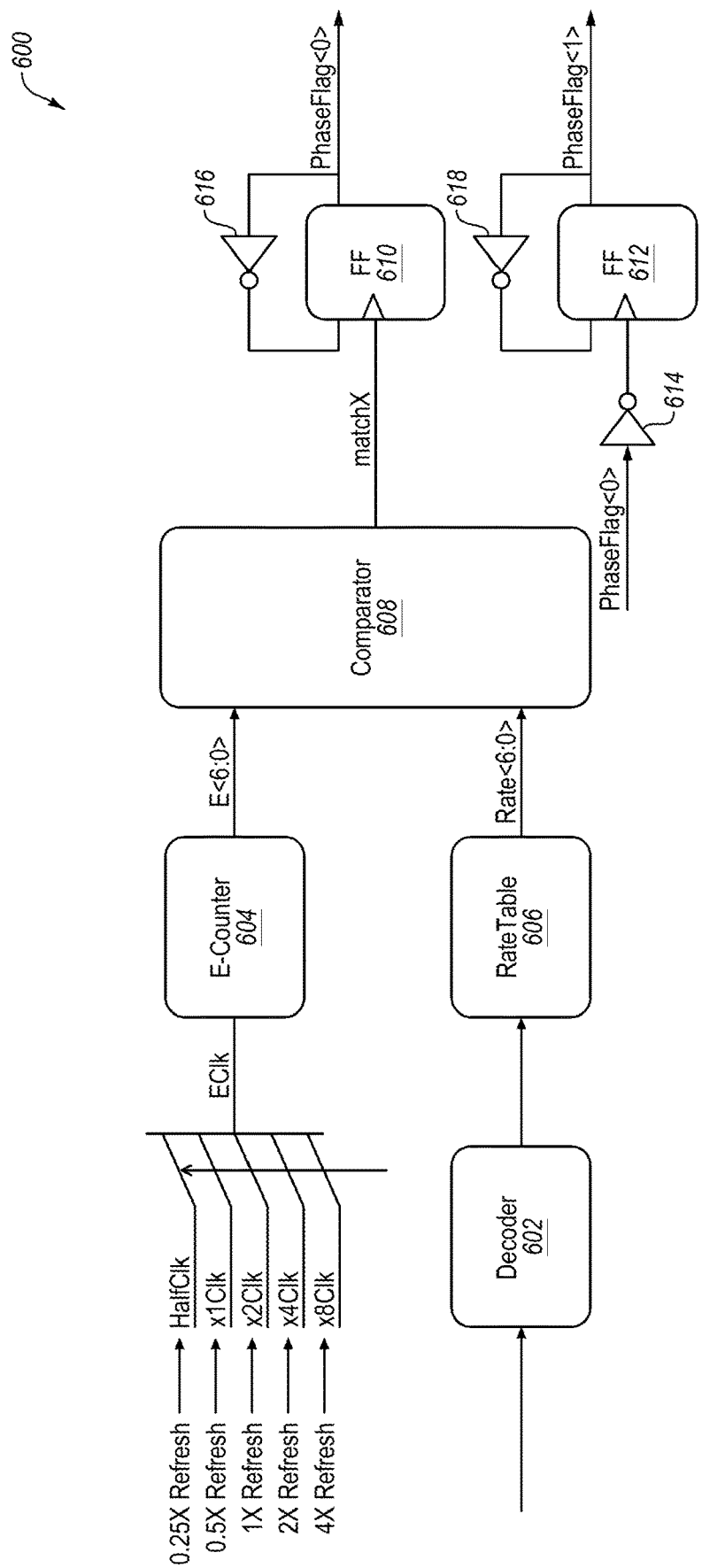
FIG. 6 is a schematic block diagram of an example circuit for generating a phase control signal, in accordance with various embodiments of the disclosure.

FIG. 6 is a schematic block diagram of an example circuit 600 for generating one or more phase control signals, in accordance with various embodiments of the present disclosure. Circuit 600, which may also be referred to as a "phase control generation circuit," includes a decoder 602, an E-counter 604, a RateTable 606, a comparator 608, and flip-flops 610 and 612. Circuit 600 further includes inverters 614, 616, and 618.

During a contemplated operation of circuit 600, a clock signal EClk may be set (e.g., via a mode register) to one of a plurality of settings (e.g., HalfClk (e.g., a frequency of a self-refresh oscillator/2, ×1Clk (e.g., a frequency of the self-refresh oscillator), ×2Clk (e.g., a frequency of the self-refresh oscillator*2, ×4Clk (e.g., a frequency of the self-refresh oscillator*4), or ×8Clk (e.g., a frequency of the self-refresh oscillator*4)). For example, clock signal EClk may be selected based on a selected refresh rate (e.g., tREFI). Further, E-counter 604, which is configured to count up to an integer, may output a count value E<6:0>.

According to various embodiments, decoder 602 may receive one or more inputs from, for example, one or more mode registers (e.g., for determining and/or setting a steal rate, and possibly a refresh rate) and output one or more select signals. The one or more select signals may be received by RateTable 606, which may be used to select a steal rate. In some embodiments, RateTable 606 may include a look-up table, which may define different numbers for different steal rates and different time durations between refreshes (tREFIs).

Comparator 608 may be configured to receive count value E<6:0> and steal rate Rate<6:0>, compare count value E<6:0> and steal rate Rate<6:0>, and output a matchX signal. If count value E<6:0> and steal rate Rate<6:0> are equal, the matchX signal may be high. Otherwise, the matchX signal may be low. A high matchX signal, which may include a narrow high pulse (e.g., see FIG. 7), received at flip-flop 610 may flip a phase control signal PhaseFlag<0> (e.g., from high to low, or from low to high) and reset count value E<6:0>.

Further, as illustrated, the phase control signal PhaseFlag<0> may be received at inverter 614, which may provide a signal to flip-flop 612. Further, in this example, in response to phase control signal PhaseFlag<0> transitioning from high to low, a phase control signal PhaseFlag<1> may flip (e.g., from high to low, or from low to high). According to various embodiments, the phase control signal PhaseFlag<0> may be used to generate the Phase<3:0> signal (see FIG. 4A). In one specific example (see FIG. 7), the Phase<0> signal may be high while both the phase control signal PhaseFlag<0> and the phase control signal PhaseFlag<1> are low, the Phase<1> signal may be high while the phase control signal PhaseFlag<0> is high and the phase control signal PhaseFlag<1> is low, the Phase<2> signal may be high while phase control signal PhaseFlag<0> is low and phase control signal PhaseFlag<1> is high, and the Phase<3> signal may be high while both phase control signal PhaseFlag<0> and phase control signal PhaseFlag<1> are high.

In some embodiments, circuit 600 may determine a phase signal (e.g., the Phase<3:0> signal) based on the phase control signal PhaseFlag<0> and/or the phase control signal PhaseFlag<1>, and the phase signal may be provided to circuit 400 of FIG. 4A. In other embodiments, the phase control signal PhaseFlag<0> and/or the phase control signal PhaseFlag<1> may be provided to phase generation circuit 450 of FIG. 4B, which may determine a phase signal (e.g., Phase<3:0>).

Figure 7:
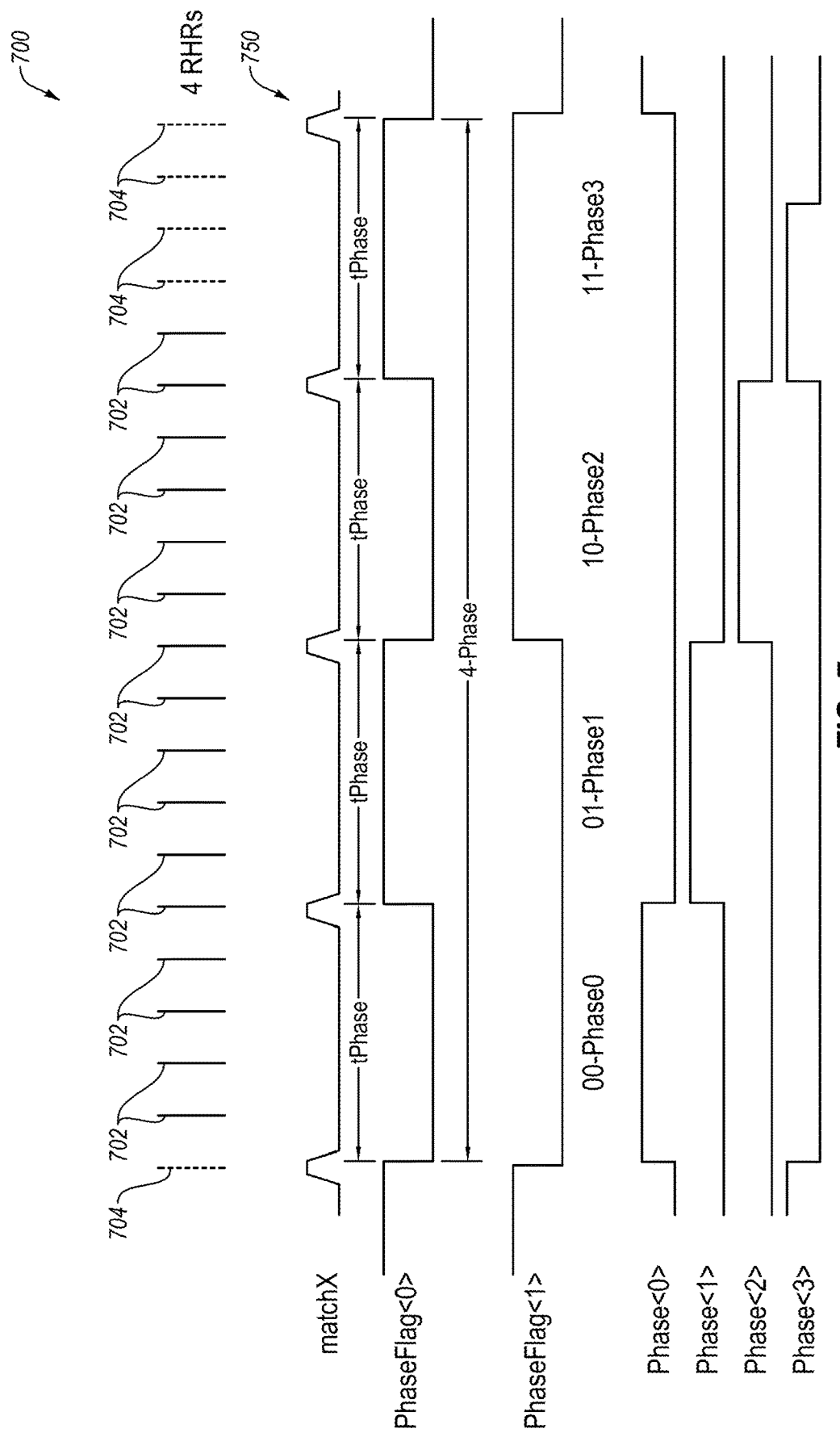
FIG. 7 illustrates an example row hammer refresh interval and an associated timing diagram including various waveforms for signals associated with the circuits of FIGS. 4A and 6.

FIG. 7 illustrates an example RHR interval 700 and an associated timing diagram 750 including various waveforms for signals associated with circuit 600 of FIG. 6, circuit 400 of FIG. 4A, and circuit 450 of FIG. 4B. As illustrated, RHR interval 700 includes a steal rate of 1/5 wherein, in this example, 4 RHRs 704 are executed after 16 auto refreshes 702 (i.e., 4 of 20 refreshes are stolen as RHRs). Further, timing diagram 750 includes a waveform for each of a plurality of phase signals Phase<0>, Phase<1>, Phase<2>, and Phase<3>, and a matchX signal. Timing diagram 750 also includes a waveform for the phase control signal PhaseFlag<0> and a waveform for the phase control signal PhaseFlag<1>.

With reference to FIGS. 6 and 7, according to various embodiments, a pulse width of PhaseFlag<0> may be one phase duration tPhase. Further, in an example wherein the steal rate is 1/5, phase duration tPhase=5*tREFI. Further, the pulse width of PhaseFlag<0> may be equal to a period of the matchX signal. Thus, phase duration tPhase may be equal to the period of the matchX signal. Accordingly, in some embodiments wherein the steal rate is 1/5, for example, Rate<6:0> may be set equal to a number "N" such that tPhase=N*EClk=5*tREFI.

In some embodiments, the phase control signal PhaseFlag<0> may align with an RHR interval (e.g., a rising or falling edge of the phase control signal PhaseFlag<0> may align with a start of the RHR interval, and a rising or falling edge of the phase control signal PhaseFlag<0> may align with an end of the RHR interval). In other embodiments, although the phase control signal PhaseFlag<0> may be asynchronies with an RHR and thus, the phase control signal PhaseFlag<0> may not align with an RHR interval. However, because the phase control signal PhaseFlag<0> may operate periodically, performance may not be degraded. Further, misalignment of the phase control signal PhaseFlag<0> and an RHR interval may increase detectability (e.g., at a fourth phase due to a shortened match period, as shown in FIG. 4A).

It is noted that circuit 600 is provided as an example circuit for generating a phase control signal, and it will be appreciated by a person having ordinary skill in the art that other circuits for generating a phase control signal may be used for implementing various embodiments of the disclosure.

According to various embodiments, known RHA detection modes, such as time-based detection modes and command-based (activate, precharge, etc.) detection modes may be used to detect RHAs. More specifically, according to some embodiments, as disclosed herein, time-based detection (also referred to as "blind hitter") may utilize randomly generated signals (e.g., SampleEnF or ArmSample) to trigger an RHA storing operation. Further, a command-based detection mode, such as a "bursty mode," may determine if an address is a frequently accessed address (a "high frequency address"). In at least some embodiments, time-based detection and command-based detection may be used together to enhance RHA detectability.

Figure 8:
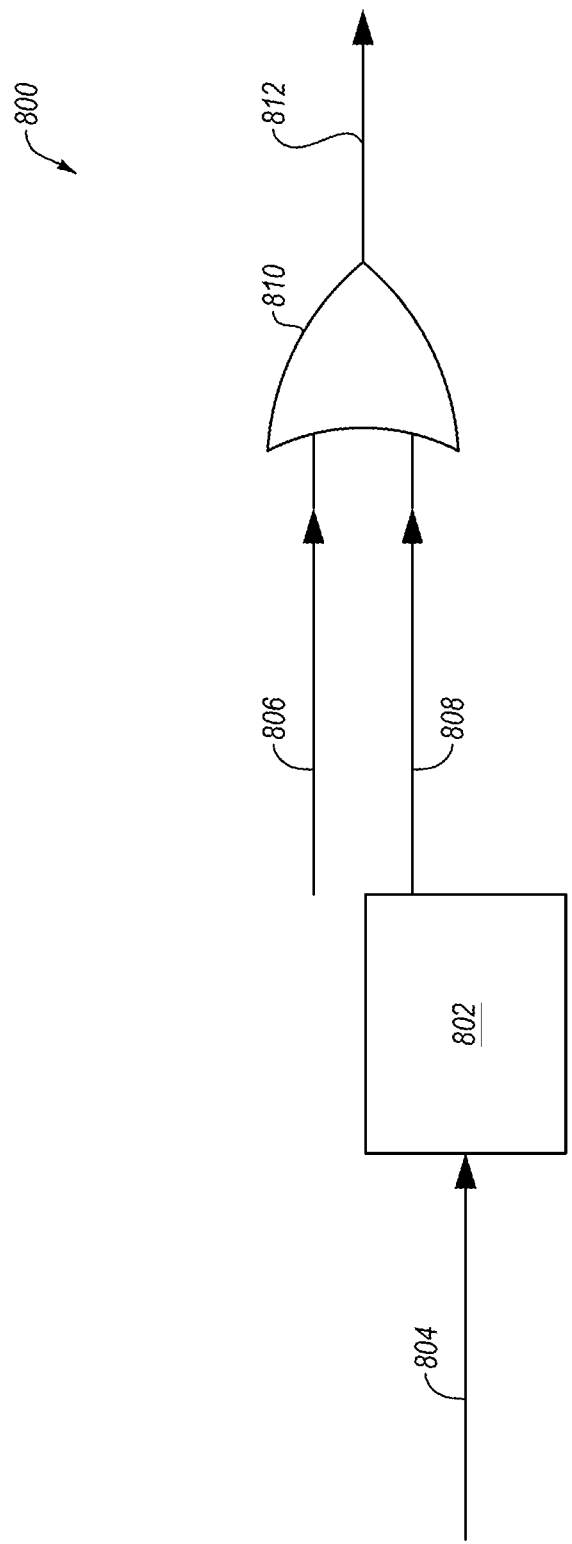
FIG. 8 is a schematic diagram of an example detection unit for generating a sampling trigger signal.

For example, FIG. 8 illustrates an RHA detection unit 800 including a filter 802 and an OR gate 810. An output of filter 802 is coupled to one input of OR gate 810. Another input of OR gate 810 is configured to receive a signal 806. OR gate 810 is configured to output a signal 812.

During a contemplated operation of RHA detection unit 800, filter 802 may receive a signal 804 and generate an output signal 808. For example, signal 804 may include a row address. Upon receipt of signal 804, filter 802 may be configured to determine if the received row address is a frequently accessed address (a "high frequency address") (e.g., the row address has undergone more than a threshold number of accesses within a period). If the received address is a frequently accessed address, output signal 808, which is provided to one input of OR gate 810, may be high. If the received address is not a frequently accessed address, output signal 808 may be low.

Another input of OR gate 810 may be configured to receive a signal 806, which may include time-based signal (e.g., SampleEnF or ArmSample). If either signal 806 or signal 808 is high, signal 812, which may include a trigger signal, may also be high. In some embodiments, the Trigger signal of FIG. 4A may include signal 812. Accordingly, various embodiments may utilize a sampling trigger signal that is based on time-based detection, command-based detection, or both.

Figure 9:
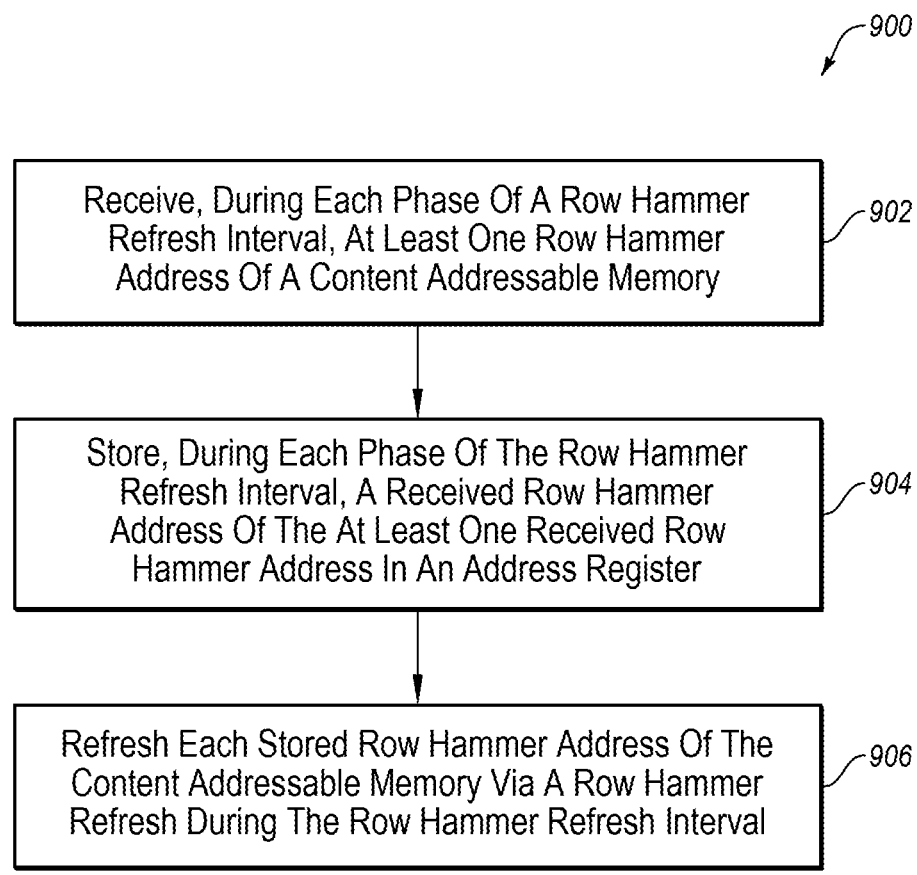
FIG. 9 is a flowchart of an example method of operating a memory device, in accordance with various embodiments of the disclosure.

FIG. 9 is a flowchart of an example method 900 for operating a memory device. Method 900 may be arranged in accordance with at least one embodiment described in the present disclosure. Method 900 may be performed, in some embodiments, by a device or system, such as circuit 400 of FIG. 4A, circuit 450 of FIG. 4B, circuit 600 of FIG. 6, detection unit 800 of FIG. 8, memory device 1100 of FIG. 11, and/or system 1200 of FIG. 12, or another device or system. Although illustrated as discrete blocks, various blocks may be divided into additional blocks, combined into fewer blocks, or eliminated, depending on the desired implementation.

Method 900 may begin at block 902, where, during each phase of an RHR interval, at least one RHA of a CAM may be received, and method 900 may proceed to block 904. For example, during each phase of a plurality of phases of the RHR interval (e.g., as shown in FIG. 5), at least one RHA may be received at a circuit (e.g., circuit 400 of FIG. 4A). More specifically, during a first phase, one or more RHAs may be received at circuit 400. During a second phase, one or more RHAs may be received at circuit 400. During a third phase, one or more RHAs may be received at circuit 400. Further, during a fourth phase, one or more RHAs may be received at circuit 400.

At block 904, during each phase of the RHR interval, a received RHA of the at least one received RHA may be stored, and method 900 may proceed to block 906. For example, during each phase of the plurality of phases of the RHR interval, a received RHA may be stored in an address register. More specifically, during a first phase, one RHA may be stored in a first register (e.g., register 404A of FIG. 4A). During a second phase, one RHA may be stored in a second register (e.g., register 404B of FIG. 4A). During a third phase, one RHA may be stored in a third register (e.g., register 404C of FIG. 4A). Moreover, during a fourth phase, one RHA may be stored in a fourth register (e.g., register 404D of FIG. 4A). According to various embodiments, each stored RHA may be different from one another. Further, according to various embodiments, the RHAs may be stored in response to a trigger signal, such as a randomly generated signal (e.g., ArmSample). In some embodiments, the RHAs may be stored in response to a trigger signal, which is based on a time-based detection mode and/or a command-based detection mode.

At block 906, each stored RHA may be refreshed via an RHR. For example, at or near the end of the RHR interval, an RHR command may be executed (e.g., via a control circuit 1104 of FIG. 11) to refresh the RHAs in the content addressable memory array (e.g., memory array 1102 of FIG. 11).

Modifications, additions, or omissions may be made to method 900 without departing from the scope of the present disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, each received RHA may be compared to data stored in one or more registers of the plurality of registers to determine whether the identified RHA is a unique RHA. Moreover, in various embodiments, one or more phase control signals (e.g., phase control signal PhaseFlag<0> and/or phase control signal PhaseFlag<1>) may be generated (e.g., via circuit 600 of FIG. 6) and/or received (e.g., at circuit 450 of FIG. 4B). Further, for example, based on one or more phase control signals (e.g., from circuit 600 of FIG. 6), one phase (e.g., a second phase) of the plurality of phases may be activated, one phase (e.g., a first phase) of the plurality of phases may be deactivated, or both.

Figure 10A:
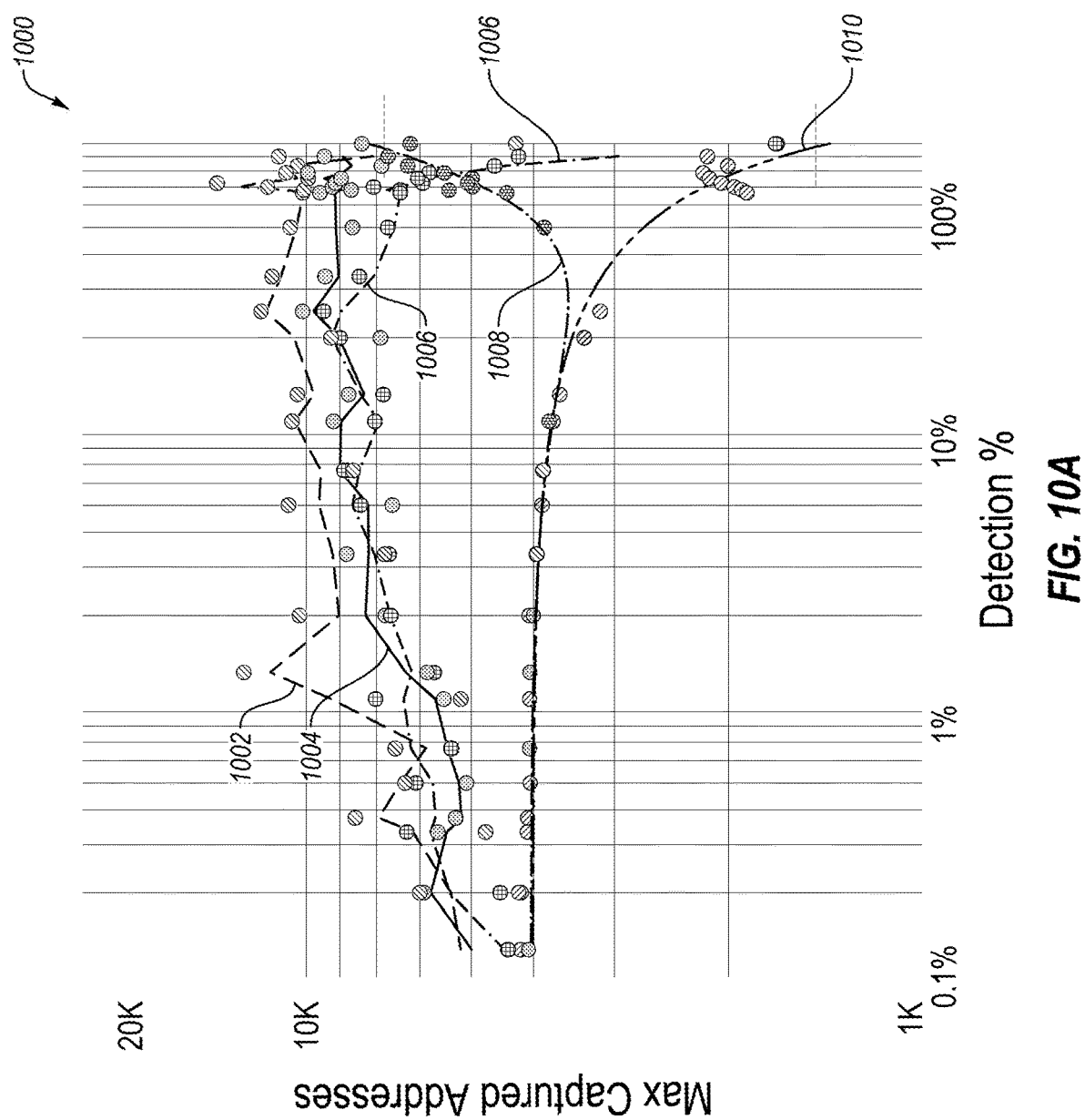
FIG. 10A is a plot depicting simulation results for various row hammer address detection modes for detecting a two seed row address.

FIG. 10A is a plot 1000 depicting simulation results for various RHA detection modes. More specifically, plot 1000 depicts simulation results for detecting a two seed row address. For various detection modes, a detection percentage of captured addresses of the two seed row is compared to a maximum number of captured address. As shown, various modes, such as a 4-phase CAM mode (indicated by signal 1006; see FIGS. 4A and 5 and associated description) and a 4-phase CAM mode used with bursty detections (indicated by signal 1010; see FIGS. 4A and 8 and associated description) exhibit enhanced detection compared to conventional modes, such as a conventional CAM scheme (indicated by signal 1002; see FIGS. 2A and 2B and associated description), a command-based mode (e.g., a bursty mode) (indicated by signal 1008), and a conventional blind mode (indicated by signal 1004).

Figure 10B:
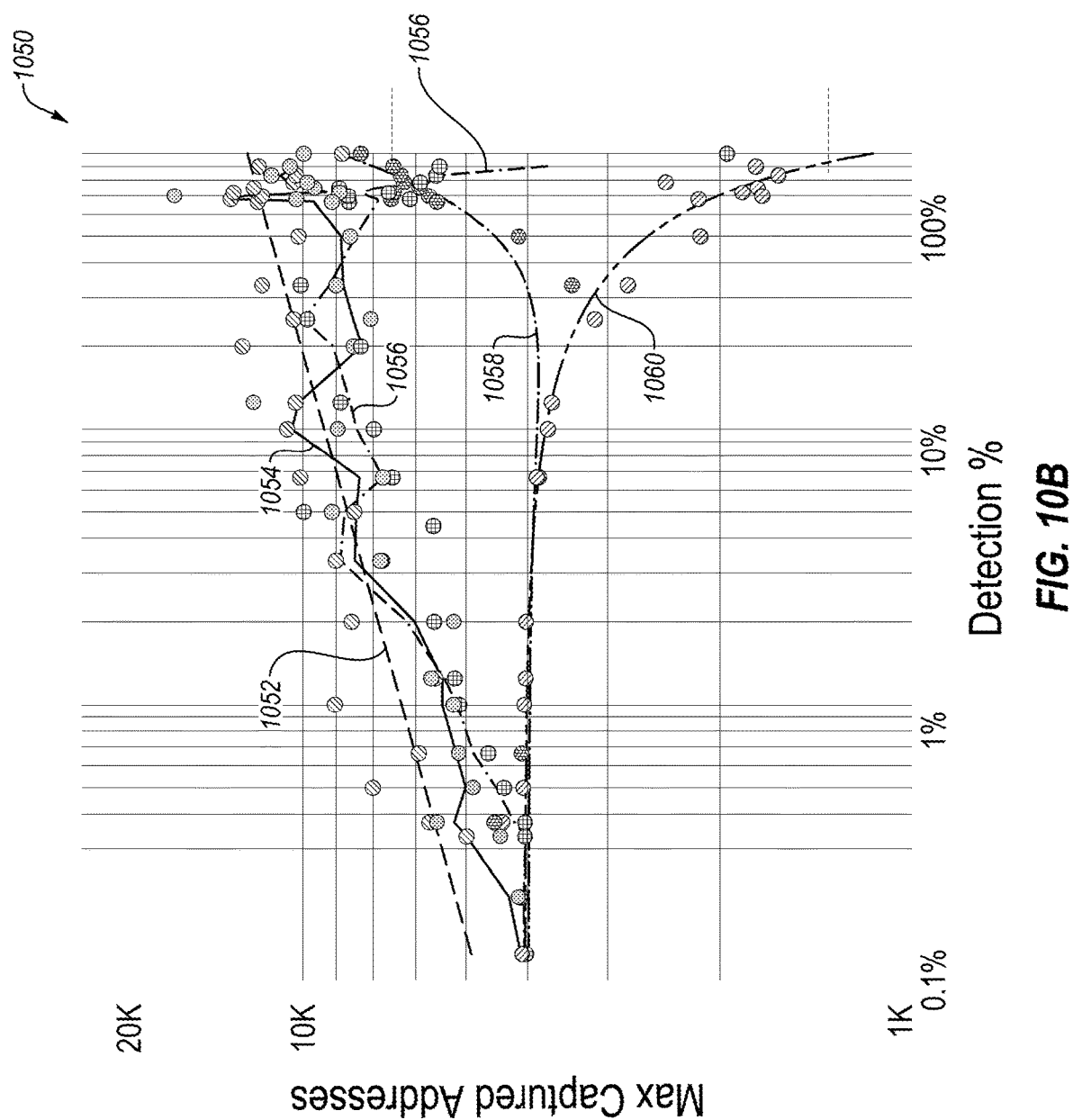
FIG. 10B is a plot depicting simulation results for various row hammer address detection modes for detecting a four seed row address.

FIG. 10B is a plot 1050 depicting simulation results for various RHA detection modes. More specifically, plot 1050 depicts simulation results for detecting a four seed row address. For various detection modes, a detection percentage of captured addresses of the four seed row is compared to a maximum number of captured address. As shown, various modes, such as a 4-phase CAM mode (indicated by signal 1056; see FIGS. 4A and 5 and associated description) and a 4-phase CAM mode used with bursty detections (indicated by signal 1060; see FIGS. 4A and 8 and associated description) exhibit enhanced detection compared to conventional modes, such as a conventional CAM scheme (indicated by signal 1052; see FIGS. 2A and 2B and associated description), a command-based mode (e.g., a bursty mode) (indicated by signal 1058), and a conventional blind mode (indicated by signal 1054).

A memory device is also disclosed. According to various embodiments, the memory device may include one or more memory arrays, such as one or more content addressable memory (CAM) arrays. The one or more memory arrays may include a plurality of CAM cells.

FIG. 11 is a simplified block diagram of a memory device 1100 implemented according to one or more embodiments described herein. Memory device 1100, which may include, for example, a semiconductor device, includes a memory array 1102, a control circuit 1104, and a sampling circuit 1106. Memory array 1102, which may include a CAM array, may include a plurality of memory cells (e.g., CAM cells).

Control circuit 1104 may be operatively coupled with memory array 1102 so as to read, write, or re-fresh any or all memory cells within memory array 1102. Control circuit 1104 may be configured for carrying out one or more embodiments disclosed herein. For example, in some embodiments, control circuit 1104, which may include, for example, circuit 400 of FIG. 4A, circuit 450 of FIG. 4B, and/or detection unit 800 of FIG. 8, may be configured to store one or more RHAs, in accordance with various embodiments disclosed herein. Alternatively or additionally, control circuit 1104 may be configured to transmit various signals (e.g., RHR commands) to memory array 1102.

In some embodiments, sampling circuit 1106, which may be coupled to each of memory array 1102 and control circuit 1104, may be configured for carrying out one or more embodiments disclosed herein. For example, sampling circuit 1106 may be configured to generate and/or provide one or more phase control signals (e.g., phase control signal PhaseFlag<0> and/or phase control signal PhaseFlag<1>; see FIG. 6) to circuit 450 (see FIG. 4B) of control circuit 1104. In some embodiments, sampling circuit 1106 may include circuit 600 of FIG. 6.

A system is also disclosed. According to various embodiments, the system may include a CAM array of memory cells. Each memory cell may include an access transistor and a storage element operably coupled with the access transistor.

Figure 12:
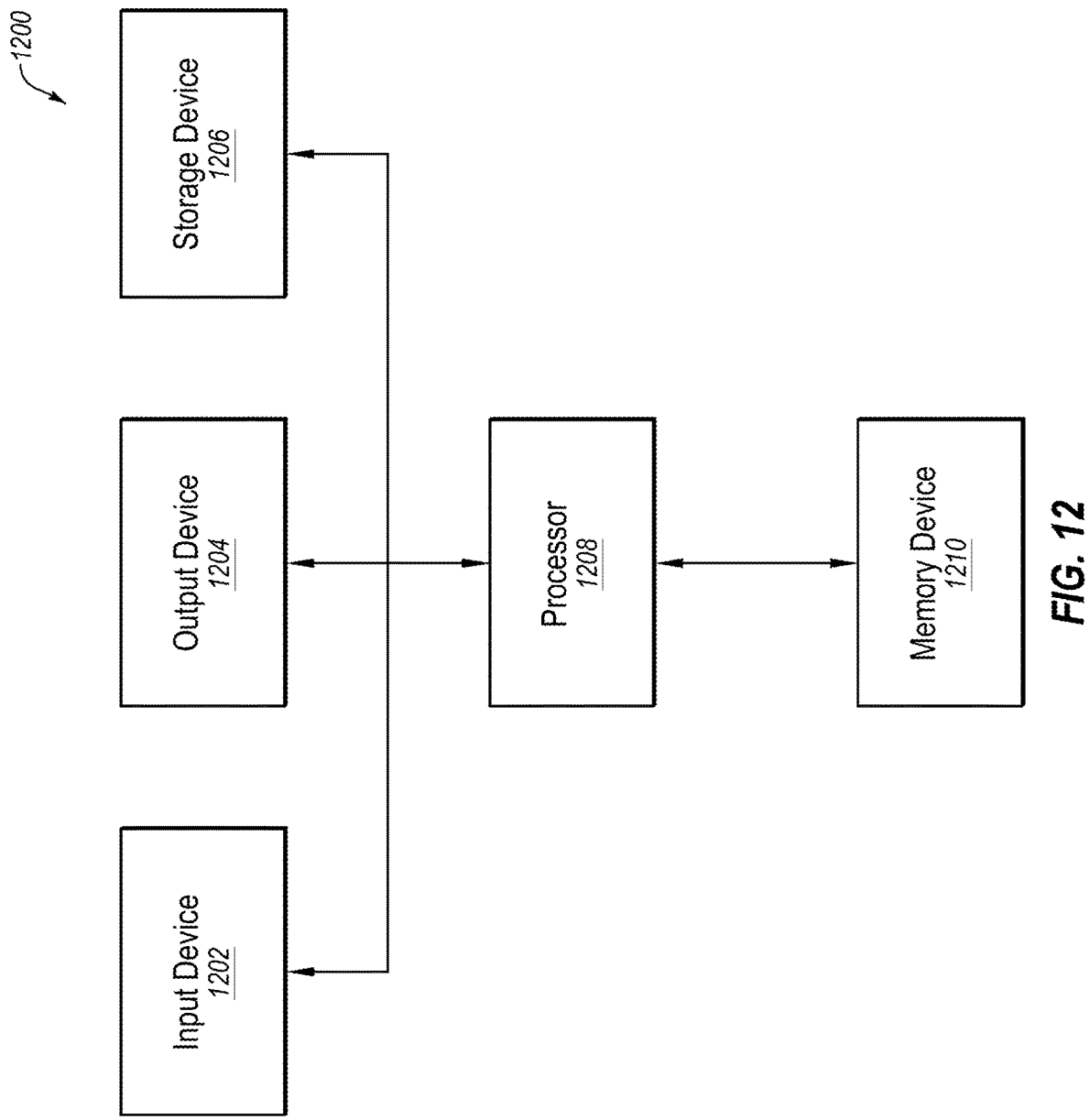
FIG. 12 is a simplified block diagram of an electronic system implemented according to one or more embodiments described herein.

FIG. 12 is a simplified block diagram of an electronic system 1200 implemented according to one or more embodiments described herein. Electronic system 1200 includes at least one input device 1202, which may include, for example, a keyboard, a mouse, or a touch screen. Electronic system 1200 further includes at least one output device 1204, such as a monitor, a touch screen, or a speaker. Input device 1202 and output device 1204 are not necessarily separable from one another. Electronic system 1200 further includes a storage device 1206. Input device 1202, output device 1204, and storage device 1206 may be coupled to a processor 1208. Electronic system 1200 further includes a memory device 1210 coupled to processor 1208. Memory device 1210, which may include memory device 1100 of FIG. 11, may include an array of memory cells. Electronic system 1200 may include, for example, a computing, processing, industrial, or consumer product. For example, without limitation, system 1200 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

According to various embodiments disclosed herein, and in contrast to some conventional methods, a flag-lock function is not required to store RHAs. Therefore, compared to conventional methods, durations of "no sampling periods" of an RHR interval may be reduced. More specifically, for example, because various embodiments may not require flag-lock functions and/or reset functionality to store RHAs, lengthy "no sampling periods" of a long RHR interval (e.g., due to a burst refresh; see e.g., FIG. 1B), may be reduced and possibly eliminated.

Further, because various embodiments of the present disclosure may reduce a number of flag and/or reset circuits of a device (e.g., a memory device) (i.e., compared to conventional RHR systems and methods), circuitry may be simplified and, thus power consumption of a device may be reduced and/or performance of the device may be enhanced.

Moreover, in some embodiments wherein more than one detection mode (e.g., blind hitter and bursty mode) is utilized, detection of RHAs may be improved. Also, because various embodiments may utilize randomly generated signals (e.g., ArmSample) to trigger a storing operation, RHA detection and/or RHR patterns may be less predictable. Accordingly, memory devices employing one or more embodiments disclosed herein may be less vulnerable to row hammer attacks (e.g., by computer hackers).

One or more embodiments of the present disclosure include a method of operating a memory device. In at least some embodiments, a method may include receiving, during each phase of a row hammer refresh (RHR) interval, at least one row hammer address (RHA) of a content addressable memory (CAM). The method may further include storing, during each phase of the RHR interval, a received RHA of the at least one received RHA in an address register. Moreover, the method may include refreshing each stored RHA of the CAM via a row hammer refresh (RHR) during the RHR interval.

Some embodiments of the present disclosure include a semiconductor device. The semiconductor device may include a content addressable memory (CAM) array including row addresses. The memory device may also include a control circuit including registers and configured to select an active phase of a row hammer refresh (RHR) interval based on a received phase control signal. For each phase, the control circuit may further be configured to: receive at least one address of the row addresses; and store, in an active register, one received address of the at least one received address as a row hammer address (RHA), wherein the active register is associated with the active phase. The control logic may also be configured to transmit an RHR signal to the CAM array to refresh each stored RHA address during the RHR interval.

Additional embodiments of the present disclosure include an electronic system. The electronic system may include at least one input device, at least one output device, at least one processor device operably coupled to the input device and the output device, and at least one semiconductor device operably coupled to the at least one processor device. The semiconductor device may include a content addressable memory (CAM) array and a control circuit coupled to the CAM array. The control circuit may be configured to store a first row hammer address (RHA) in a first register during a first phase of a row hammer refresh (RHR) interval. The control circuit may also be configured to store a second RHA in a second register during a second phase of the RHR interval. Further, the control circuit may be configured to store a third RHA in a third register during a third phase of the RHR interval. Moreover, the control circuit may be configured to store a fourth RHA in a fourth register during a fourth phase of the RHR interval. Furthermore, the control circuit may be configured to transmit an RHR signal to the CAM array to refresh each of the first RHA, the second RHA, the third RHA, and the fourth RHA of the CAM array during the RHR interval.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of operating a memory device, comprising:
receiving, during each phase of a row hammer refresh (RHR) interval, at least one row hammer address (RHA) of a content addressable memory (CAM);
storing, during each phase of the RHR interval and in response to a randomly generated trigger signal during each phase of the RHR interval, a received RHA of the at least one received RHA in an address register; and
refreshing each stored RHA of the CAM via a RHR during the RHR interval.

2. The method of claim 1, further comprising comparing each received RHA to data stored in one or more address registers to determine whether the received RHA is a unique RHA.

3. The method of claim 2, wherein storing the RHA comprises storing the RHA in response to determining the received RHA is a unique RHA.

4. The method of claim 1, further comprising transition from one phase to another phase based on a phase control signal, the phase control signal based on a settable steal rate and a settable refresh rate for the CAM.

5. The method of claim 1, wherein receiving the at least one RHA during each phase of the RHR interval comprises receiving a first RHA during a phase and subsequently receiving a second RHA during the phase, wherein storing comprises storing the first RHA in a first register and subsequently storing the second RHA in the first register overwriting the first RHA.

6. The method of claim 1, wherein receiving the at least one RHA during each phase comprises receiving one or more RHAs during each of four phases of the RHR interval.

7. A semiconductor device, comprising:
a content addressable memory (CAM) array including row addresses; and
a control circuit including registers and configured to select an active phase of a row hammer refresh (RHR) interval based on a received phase control signal, the control circuit further configured to, for each phase of the RHR interval:
receive at least one address of the row addresses; and
store, in an active register, one received address of the at least one received address as a row hammer address (RHA), the active register associated with the active phase;
the control circuit further configured to transmit an RHR signal to the CAM array to refresh each stored RHA address during the RHR interval.

8. The semiconductor device of claim 7, wherein the control circuit is further configured to determine whether the at least one received active address is unique to one or more addresses stored in one or more registers.

9. The semiconductor device of claim 7, wherein the control circuit is configured to store the one received active address as the RHA in response to determining the one received active address is unique to the one or more stored addresses in the registers.

10. The semiconductor device of claim 7, wherein the registers comprise four registers.

11. The semiconductor device of claim 7, wherein the control circuit is further configured to receive at least one trigger signal during each phase, wherein the control circuit is configured to store the address of the at least one received active address in response to a trigger signal of the at least one trigger signal.

12. The semiconductor device of claim 7, further comprising a phase control circuit configured to:
generate the phase control signal based on a selectable steal rate and a selectable refresh rate; and
convey the phase control signal to the control circuit.

13. An electronic system, comprising:
at least one input device;
at least one output device;
at least one processor device operably coupled to the input device and the output device; and
at least one semiconductor device operably coupled to the at least one processor device and comprising:
a content addressable memory (CAM) array: and
a control circuit coupled to the CAM array and configured to:
store a first row hammer address (RHA) in a first register during a first phase of a row hammer refresh (RHR) interval;
store a second RHA in a second register during a second phase of the RHR interval;
store a third RHA in a third register during a third phase of the RHR interval;
store a fourth RHA in a fourth register during a fourth phase of the RHR interval; and
transmit an RHR signal to the CAM array to refresh each of the first RHA, the second RHA, the third RHA, and the fourth RHA of the CAM array during the RHR interval.

14. The electronic system of claim 13, wherein the control circuit is further configured to:
compare, during the first phase of the RHR interval, the first RHA to one or more addresses stored in one or more registers;
compare, during the second phase of the RHR interval, the second RHA to one or more addresses stored in the one or more registers;
compare, during the third phase of the RHR interval, the third RHA to one or more addresses stored in the one or more registers; and
compare, during the fourth phase of the RHR interval, the fourth RHA to one or more addresses stored in the one or more registers.

15. The electronic system of claim 13, wherein the control circuit is configured to:
store the first RHA in the first register during the first phase based on the comparison of the first RHA to the one or more addresses stored in the one or more registers;
store the second RHA in the second register during the second phase based on the comparison of the second RHA to the one or more addresses stored in the one or more registers;
store the third RHA in the third register during the third phase based on the comparison of the third RHA to the one or more addresses stored in the one or more registers; and
store the fourth RHA in the fourth register during the fourth phase based on the comparison of the fourth RHA to the one or more addresses stored in the one or more registers.

16. The electronic system of claim 13, wherein the control circuit is further configured to:
store the first RHA in the first register in response to a randomly generated trigger signal during the first phase of the RHR interval;
store the second RHA in the second register in response to a randomly generated trigger signal during the second phase of the RHR interval;
store the third RHA in the third register in response to a randomly generated trigger signal during the third phase of the RHR interval; and
store the fourth RHA in the fourth register in response to a randomly generated trigger signal during the fourth phase of the RHR interval.

17. The electronic system of claim 13, wherein the control circuit is further configured to:
receive at least one phase control signal;
control a phase signal based on the at least one phase control signal; and
control a sample clock signal based on the phase signal.

18. The electronic system of claim 13, wherein the control circuit is further configured to generate a trigger signal to store each of the first RHA, the second RHA, the third RHA, and the fourth RHA based on at least two detection modes.

19. The electronic system of claim 18, wherein the at least two detection modes includes a time-based detection mode and a command-based detection mode.

* * * * *